(12) United States Patent
Ploessl

(10) Patent No.: US 10,147,696 B2
(45) Date of Patent: Dec. 4, 2018

(54) ELECTRONIC DEVICE AND METHOD FOR PRODUCING AN ELECTRONIC DEVICE

(71) Applicant: OSRAM Opto Semiconductors GmbH, Regensburg (DE)

(72) Inventor: Andreas Ploessl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/514,524

(22) PCT Filed: Sep. 17, 2015

(86) PCT No.: PCT/EP2015/071356
§ 371 (c)(1),
(2) Date: Mar. 26, 2017

(87) PCT Pub. No.: WO2016/062464
PCT Pub. Date: Apr. 28, 2016

(65) Prior Publication Data
US 2017/0271295 A1    Sep. 21, 2017

(30) Foreign Application Priority Data

Oct. 21, 2014 (DE) ........................ 10 2014 115 319

(51) Int. Cl.
*H01L 23/488* (2006.01)
*H01L 23/00* (2006.01)
(Continued)

(52) U.S. Cl.
CPC .............. *H01L 24/29* (2013.01); *H01L 23/15* (2013.01); *H01L 23/49866* (2013.01);
(Continued)

(58) Field of Classification Search
CPC ... H01L 2224/27505; H01L 2224/8084; H01L 2224/8184; H01L 2224/8284; H01L 23/49513; H01L 24/15; H01L 21/2412
(Continued)

(56) References Cited

U.S. PATENT DOCUMENTS 4,903,885 A    2/1990  Schwarzbauer
8,950,653 B2 *  2/2015  Schafer ................ B22F 1/0062
                                                148/23
(Continued)

FOREIGN PATENT DOCUMENTS

CN    102791421 A    11/2012
CN    103222039 A    7/2013
(Continued)

OTHER PUBLICATIONS

Bakker, H., et al., "Landolt-Börnstein: Zahlenwerte und Funktionen aus Naturwissenschaften und Technik," Springer, vol. 26, 1990, pp. 1-14.
(Continued)

*Primary Examiner* — George Fourson, III
(74) *Attorney, Agent, or Firm* — Slater Matsil, LLP

(57) ABSTRACT

An electronic device and a method for producing an electronic device are disclosed. In an embodiment the electronic device includes a first component and a second component and a sinter layer connecting the first component to the second component, the sinter layer comprising a first metal, wherein at least one of the components comprises at least one contact layer which is arranged in direct contact with the sinter layer, which comprises a second metal different from the first metal and which is free of gold.

16 Claims, 3 Drawing Sheets

(51) Int. Cl.
*H01L 33/40* (2010.01)
*H01L 33/62* (2010.01)
*H01L 23/15* (2006.01)
*H01L 23/498* (2006.01)
*H01L 23/495* (2006.01)

(52) U.S. Cl.
CPC .............. *H01L 24/05* (2013.01); *H01L 24/32* (2013.01); *H01L 24/83* (2013.01); *H01L 33/40* (2013.01); *H01L 33/62* (2013.01); *H01L 23/49513* (2013.01); *H01L 24/03* (2013.01); *H01L 24/11* (2013.01); *H01L 24/13* (2013.01); *H01L 24/15* (2013.01); *H01L 24/16* (2013.01); *H01L 24/27* (2013.01); *H01L 24/81* (2013.01); *H01L 2224/0345* (2013.01); *H01L 2224/0401* (2013.01); *H01L 2224/04026* (2013.01); *H01L 2224/05082* (2013.01); *H01L 2224/05124* (2013.01); *H01L 2224/05155* (2013.01); *H01L 2224/05166* (2013.01); *H01L 2224/05171* (2013.01); *H01L 2224/05669* (2013.01); *H01L 2224/05673* (2013.01); *H01L 2224/05678* (2013.01); *H01L 2224/1132* (2013.01); *H01L 2224/1141* (2013.01); *H01L 2224/11334* (2013.01); *H01L 2224/11436* (2013.01); *H01L 2224/13294* (2013.01); *H01L 2224/13339* (2013.01); *H01L 2224/13347* (2013.01); *H01L 2224/16227* (2013.01); *H01L 2224/16245* (2013.01); *H01L 2224/2732* (2013.01); *H01L 2224/2741* (2013.01); *H01L 2224/27334* (2013.01); *H01L 2224/27436* (2013.01); *H01L 2224/29083* (2013.01); *H01L 2224/29084* (2013.01); *H01L 2224/29124* (2013.01); *H01L 2224/29139* (2013.01); *H01L 2224/29147* (2013.01); *H01L 2224/29155* (2013.01); *H01L 2224/29166* (2013.01); *H01L 2224/29169* (2013.01); *H01L 2224/29171* (2013.01); *H01L 2224/29173* (2013.01); *H01L 2224/29178* (2013.01); *H01L 2224/29294* (2013.01); *H01L 2224/29339* (2013.01); *H01L 2224/29347* (2013.01); *H01L 2224/32227* (2013.01); *H01L 2224/32245* (2013.01); *H01L 2224/32503* (2013.01); *H01L 2224/73265* (2013.01); *H01L 2224/8184* (2013.01); *H01L 2224/81191* (2013.01); *H01L 2224/81192* (2013.01); *H01L 2224/81193* (2013.01); *H01L 2224/81201* (2013.01); *H01L 2224/81203* (2013.01); *H01L 2224/81205* (2013.01); *H01L 2224/81207* (2013.01); *H01L 2224/81208* (2013.01); *H01L 2224/81469* (2013.01); *H01L 2224/81473* (2013.01); *H01L 2224/81478* (2013.01); *H01L 2224/8384* (2013.01); *H01L 2224/83191* (2013.01); *H01L 2224/83192* (2013.01); *H01L 2224/83193* (2013.01); *H01L 2224/83201* (2013.01); *H01L 2224/83203* (2013.01); *H01L 2224/83205* (2013.01); *H01L 2224/83207* (2013.01); *H01L 2224/83208* (2013.01); *H01L 2224/83359* (2013.01); *H01L 2224/83439* (2013.01); *H01L 2224/83447* (2013.01); *H01L 2224/83469* (2013.01); *H01L 2224/83473* (2013.01); *H01L 2224/83478* (2013.01); *H01L 2924/00015* (2013.01); *H01L 2924/1033* (2013.01); *H01L 2924/10349* (2013.01); *H01L 2924/12041* (2013.01); *H01L 2924/12042* (2013.01); *H01L 2924/12043* (2013.01); *H01L 2924/13014* (2013.01); *H01L 2924/13064* (2013.01); *H01L 2924/15724* (2013.01)

(58) Field of Classification Search
USPC .......................................... 257/741; 438/661
See application file for complete search history.

(56) References Cited

U.S. PATENT DOCUMENTS

| | | | | |
|---|---|---|---|---|
| 2009/0032293 | A1* | 2/2009 | Miyakawa | C08G 59/66 174/257 |
| 2010/0093131 | A1* | 4/2010 | Maeda | B23K 1/0016 438/107 |
| 2010/0270515 | A1* | 10/2010 | Yasuda | B22F 1/0074 252/514 |
| 2011/0012262 | A1* | 1/2011 | Morita | H01L 24/29 257/741 |
| 2013/0216848 | A1* | 8/2013 | Kalich | B22F 1/02 428/554 |
| 2013/0328204 | A1* | 12/2013 | Zommer | B23K 1/20 257/765 |
| 2014/0021620 | A1 | 1/2014 | Lee et al. | |
| 2014/0312361 | A1* | 10/2014 | Ohtsu | H01L 24/83 257/77 |
| 2016/0027765 | A1* | 1/2016 | von Malm | H01L 25/167 257/72 |
| 2017/0229424 | A1* | 8/2017 | Eisele | H01L 24/83 |

FOREIGN PATENT DOCUMENTS

| | | |
|---|---|---|
| CN | 105051901 A | 11/2015 |
| DE | 102008055138 A1 | 7/2010 |
| DE | 102009040078 A1 | 3/2011 |
| DE | 102013204883 A1 | 9/2014 |
| EP | 2028699 A2 | 2/2009 |
| JP | S5136885 A | 3/1976 |
| JP | H07169781 A | 7/1995 |
| JP | 2007294899 A | 11/2007 |
| JP | 2012089657 A | 5/2012 |
| JP | 2014043382 A | 3/2014 |
| WO | 2012066803 A1 | 5/2012 |
| WO | 2013185839 A1 | 12/2013 |
| WO | 2014139849 A1 | 9/2014 |

OTHER PUBLICATIONS

Moghadam, F., et al., "Oxygen Diffusion and Solubility Studies in Ag and Pt Using AC Impedance Spectroscopy," J. Electrochem. Soc., Electrochemical Science and Technology, Jul. 1986, pp. 1329-1332.

Schnitzer, I., et al., "30% external quantum efficiency from surface textured, thin-film light-emitting diodes," Appl. Phys. Lett., vol. 63, No. 16, Oct. 18, 1993, pp. 2174-2176.

* cited by examiner

ELECTRONIC DEVICE AND METHOD FOR PRODUCING AN ELECTRONIC DEVICE

This patent application is a national phase filing under section 371 of PCT/EP2015/071356, filed Sep. 17, 2015, which claims the priority of German patent application 10 2014 115 319.7, filed Oct. 21, 2014, each of which is incorporated herein by reference in its entirety.

TECHNICAL FIELD

An electronic device and a method for producing an electronic device are provided. In particular, the electronic device comprises a sinter layer.

BACKGROUND

It is common for components, which are joined to one another by means of sintering, to comprise contact surfaces in the form of thin cover layers made of gold. For example, underlying layers that are prone to oxidation can be covered by means of such cover layers and thus be protected. Since, on the one hand, sinter layers, e.g., of silver, may have a high solubility and diffusivity of oxygen, and, on the other hand, gold may dissolve in silver in the course of time, there is a risk that the ground below a gold cover layer oxidizes over time. Experience has shown that a sinter layer easily loses grip on an oxide layer forming in this way underneath the sinter layer, putting the long-term stability of the sintered connection at risk.

To avoid such problems, gold layers, which turn out to be very thick with a thickness of at least 100 nm and thus also very expensive, have mostly been used. Alternatively, palladium is used as a cheaper noble metal variant, which is covered with a very thin gold layer having a thickness in the range of a few nanometers. Furthermore, it is also known to use thick silver layers for coverage. However, again an adhesive layer made of a noble metal is to be placed underneath a thick silver layer when porous silver sinter layers, which usually develop in a pressure-free sintering process, are used, for example, in order to suppress de-wetting of silver on a metal oxide layer developing on non-precious adhesive layers in the long run.

SUMMARY OF THE INVENTION

Embodiments of the invention provide a device in which two components are connected using a sinter layer.

According to at least one embodiment, an electronic device comprises a first and a second component, which are connected to one another using a sinter layer. The sinter layer comprises a first metal or is of a first metal.

According to another embodiment, a method for producing an electronic device having at least a first component and a second component comprises a method step, in which a sintering material is arranged between the first component and the second component. The sintering material can be applied on the first component, for example. Subsequently, the second component can be applied on the sintering material applied on the first component. Alternatively, the sintering material can be applied on the second component. Subsequently, the first component can be applied on the sintering material applied on the second component. Furthermore, it is also possible to apply the first or second component on the sintering material and subsequently place it on the other component together with the sintering material. Furthermore, it is also possible to apply sintering material on both components and to place them on each other after that. Subsequently, the sintering material is sintered between the first and second component to be the sinter layer. This sintering process can be affected under the influence of heat and/or pressure and/or ultrasound during a sintering time. In particular, for instance the application of uni-axial pressure in addition to a heat treatment may contribute to the forming of the sinter connection.

The features and embodiments described above and hereinafter similarly apply to the electronic device and to the method for producing the electronic device.

According to another embodiment, at least one of the components, i.e., at least the first component and/or at least the second component, comprises at least one contact layer, which is arranged in direct contact to the sinter layer. The contact layer comprises a second metal, which is different from the first metal of the sinter layer. The second metal of the contact layer is arranged in direct contact to the first metal of the sinter layer. In particular, the contact layer is free of gold.

According to another embodiment, the contact layer comprises or is of a noble metal as the second metal. As a result, the contact layer forms a noble metal surface, on which the sinter layer is directly applied. The second metal of the contact layer comprises, instead of gold, which is dissolved in silver of a silver sinter layer, for example, a metal that has a miscibility gap to the first metal, namely to silver, for example, or which at least passivates itself via the formation of intermetallic compounds with the first metal of the sinter layer. As a result, the contact layer can be maintained as a protection of an underlying non-noble and thus oxidizable layer during the service life of the electronic device, for example. Thus, the contact layer may comprise a suitable contact material when using a metal sinter connection, which material can ensure a connection that is stable in the long run in particular in an oxygen-containing environment while using as little noble metal as possible.

According to another embodiment, the contact layer comprises or is of platinum and/or rhodium and/or iridium. This means that the contact layer can comprise or can be made of at least one or multiple materials selected from platinum, rhodium and iridium. It has been found that a layer comprising or made of platinum and/or rhodium and/or iridium is more stable than gold against a dissolution in a silver layer, for example, since platinum, rhodium and iridium have a significantly lower susceptibility to a diffusion in silver compared to gold due to the higher melting point (Ir: 2466° C., Rh: 1966° C., Pt: 1772° C., Au: 1064° C.). The above materials can be applied by means of a deposition method such as vaporization or sputtering, for example.

According to another embodiment, the sinter layer comprises silver and/or copper. Thus, the sinter layer may comprise or be made of silver and/or copper as the first metal, for example, so that platinum and/or rhodium and/or iridium can be used as a contact material of the contact layer for a silver sinter layer or a copper sinter layer. As already described above in conjunction with silver as the first metal of the sinter layer, a contact layer comprising or being made of platinum and/or rhodium and/or iridium can be advantageous also if copper is the first metal of the sinter layer.

According to another embodiment, the sinter layer is permeable to oxygen. This may be due to the fact that the sinter layer comprises or is made of a material such as the first metal, which is permeable to oxygen. Furthermore, permeability for oxygen can also be provided or co-influenced by the structure of the sinter layer. In particular, the sinter layer may consist of or at least comprise a porous material, in particular the first metal.

According to another embodiment, the contact layer comprises a layer thickness of equal to or greater than 5 nm, or equal to or greater than 15 nm, or equal to or greater than 30 nm. Furthermore, the contact layer may have a layer thickness of equal to or less than 500 nm, or equal to or less than 100 nm, or equal to or less than 60 nm. In particular, the layer thickness of the contact layer can be between 5 nm and 500 nm, preferably between 15 nm and 100 nm, and particularly preferably between 30 nm and 60 nm, the limits being included, respectively. A contact layer having a layer thickness of 40 nm may turn out to be particularly advantageous.

In the electronic device described herein, the sintering material, i.e., a material that contains or consists of the first metal, is contacted directly with the contact layer of the first and/or the second components in the form of a paste or a pre-compacted dry body. An intermediate layer, for example, of silver or gold, can be omitted as a result. The sinter layer, which may particularly form a pore-containing joining layer, is thus in direct contact to the contact layer.

According to another embodiment, the contact layer is applied on a layer made of an oxidizable material. This may particularly mean that the component, which comprises the contact layer with the second metal, further comprises a layer of an oxidizable material, which is covered by the contact layer. In particular, the oxidizable material may be a metal, which easily oxidizes when in contact with oxygen. The contact layer covers the layer of the oxidizable material in such a way that this layer is protected from surrounding gases and particularly from oxygen by the contact layer. The oxidizable material may comprise or be made of titanium, nickel, chromium and/or aluminum, for example. The contact layer and an underlying further layer of this type or even multiple further layers may form a contact arrangement for electric contacting.

According to another embodiment, each of the components, i.e., the first component and the second component, comprises in each case one contact layer, which is arranged in direct contact to the sinter layer, which comprises a metal that is different from the metal of the sinter layer and which is free of gold. For example, the first component and the second component may comprise a contact layer having a same second metal. Alternatively, it can also be possible for the first component to comprise a contact layer with a second metal and for the second component to comprise a contact layer with a third metal, wherein the second metal and the third metal are different from one another. The contact layers of the first and the second component can be formed in each case according to at least one of the above described embodiments, so that the second and possibly the third metal may each comprise or be made of platinum and/or rhodium and/or iridium.

According to another embodiment, the first component comprises a carrier element or is formed as a carrier element, on which the second component is mounted by means of the sinter layer. The carrier element can be selected from a lead frame, a plastic carrier, a plastic housing, a ceramic carrier, a circuit board or a combination thereof, for example. For example, the first component may be a ceramic carrier, e.g., of AlN, or a metal core board, for example. Furthermore, the first component may also be a lead frame, which is molded with plastic prior to or after the mounting process of the second component. The first carrier element may comprise at least one contact surface in the form of the previously described contact layer with the second metal, on which the second component is mounted by means of the sinter layer.

According to another embodiment, the second component is an electronic semiconductor chip. The electronic semiconductor chip can be embodied as an optoelectronic semiconductor chip in the form of a light-emitting diode chip, laser diode chip or photo diode chip, for example. Moreover, the second component can also be a solar cell. Furthermore, the electronic semiconductor chip can be a power semiconductor component such as a transistor, for example. For example, the second component can be formed as a field effect transistor such as a high-electron-mobility transistor, HEMT, for example.

BRIEF DESCRIPTION OF THE DRAWINGS

Further advantages, advantageous embodiments and developments result from the exemplary embodiments described in the following in conjunction with the figures.

The figures show in.

Figure 1:
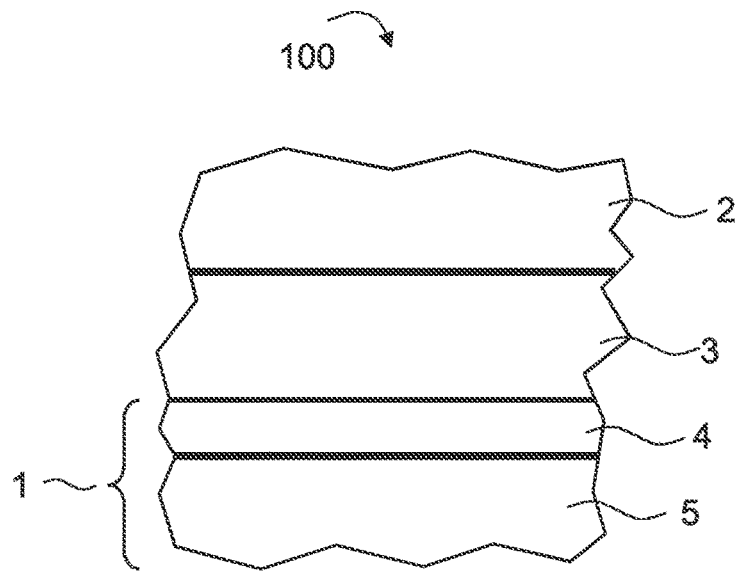
FIG. 1 a schematic illustration of a device according to an exemplary embodiment, FIGS. 2 to 4 schematic illustrations of devices according to further exemplary embodiments, and FIG. 5 temperature-dependent diffusion coefficients of some metals.

In the exemplary embodiments and figures, like, similar or equivalent elements may in each case be provided with like reference numerals. The elements illustrated and the dimensional relations among them are not drawn to scale, individual elements such as layers, components, elements and regions may rather be illustrated in an exaggerated size for a better understanding and/or illustration.

DETAILED DESCRIPTION OF ILLUSTRATIVE EMBODIMENTS

FIG. 1 shows an exemplary embodiment for an electronic device 100 comprising a first component 1 and a second component 2. A sinter layer 3 having a first metal is arranged between the first component 1 and the second component 2, the sinter layer connecting the first and second component 1, 2. For example, the first component 1 may be a carrier element and the second component 2 may be an electronic semiconductor chip, e.g., in the form of an optoelectronic semiconductor chip such as a light-emitting diode chip, a laser diode chip or a photo diode chip, or in the form or a power semiconductor component such as a transistor. Particularly preferably, the sinter layer 3 may comprise or be made of silver and/or copper.

For the production of the electronic device 100, the first component 1 is provided. A sintering material is applied on the first component 1, which is applied in the form of a solvent-containing paste by means of a doctor blade or by printing, for example. The sintering material can comprise particles, for example, powder grains and/or flakes, of the first metal. If a sinter layer 3 is produced from silver, for example, a paste having silver particles can be applied as the sintering material. Alternatively, a pre-compacted dry body with the sintering material can be arranged between the first component 1 and the second component 2. The sintering material may contain further materials and additives, which may influence the processability of the sintering material and/or the sintering process.

By sintering the sintering material, a connection between individual particles of the sintering material is effected only by a baking of the particles in the solid phase without melting of the sintering material. Sintering can be effected under the influence of heat and/or pressure and/or ultrasound during a required sintering time. Organic binders, solvents or other additives present in the sintering material for a better processability are decomposed by the sintering process or removed from the sintering material, which is why no organic matrix remains the in the connection layer produced by sintering. The particles of the sintering material can be sintered into a porous joining body in the finished sinter layer. The connection between the individual particles is very strong and will be operated in normal operation temperatures for electronic devices below 200° C. far below the melting point of the described sintering materials.

The first component 1 comprises a contact layer 4, which is arranged on the carrier 5. For example, the carrier 5 may be a ceramic body. Furthermore, the carrier 5 and the contact layer 4 may be parts of a circuit board, in which the second component 2 is mounted by means of the sinter layer 3.

The contact layer 4 is arranged in direct contact to the sinter layer 3. The contact layer 4 comprises a second metal, which is different from the first metal of the sinter layer 3 and which is free of gold. In particular, the second metal of the contact layer 4 is in direct contact to the first metal of the sinter layer 3. The sinter layer 3 may be permeable to oxygen, while the contact layer 4 may form a protection for underlying layers and regions, which might easily be oxidized by oxygen from the surroundings. To that end, the contact layer 4 comprises a metal, which has a miscibility gap to the first metal of the sinter layer 3 or which at least passivates itself via the formation of intermetallic compounds with the first metal of the sinter layer 3. In particular, in the exemplary embodiment shown, the contact layer 4 comprises or is made of platinum and/or rhodium and/or iridium.

Figure 5:
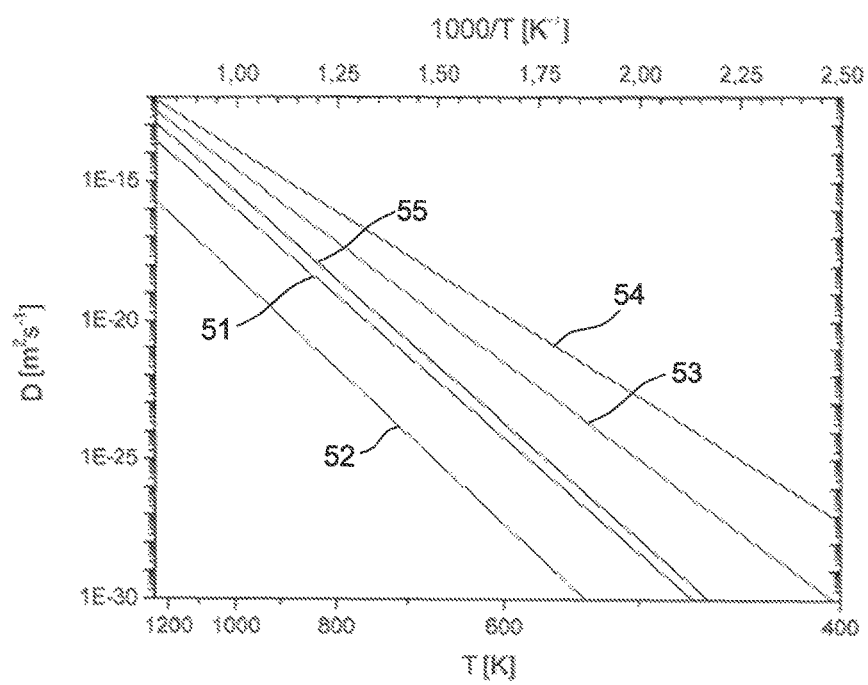

In this context, FIG. 5 shows diffusion coefficients D depending on a temperature T for Pt in Ag (curve 51), for Ag in Pt (curve 52), for Au in Ag (curve 53), for Ag in Au (curve 54) and for Pd in Ag (curve 55), the data taken from the publication "Zahlenwerte und Funktionen aus Naturwissenschaft und Technik", Landolt-Börnstein, Berlin, Springer, Vol. 26, 1990. It can be easily discerned in the curves of FIG. 5 that the susceptibility to a diffusion of platinum in silver and vice versa is significantly lower than the susceptibility to a diffusion for gold in silver and vice versa as well as for palladium in silver. A similar behavior can be assumed for rhodium and iridium. Accordingly, the diffusion constant for the first metal of the sinter layer 3 in the second metal of the contact layer 4 in typical operation temperatures for semiconductor chips such as light-emitting diode chips can preferably be equal to or less than $1\times10^{-24}$ m$^2$s$^{-1}$, or equal to or less than $1\times10^{-25}$ m$^2$s$^{-1}$, or equal to or less than $1\times10^{-26}$ m$^2$s$^{-1}$, or equal to or less than $1\times10^{-28}$ m$^2$s$^{-1}$. Furthermore, platinum, rhodium and iridium are not or at least not substantially soluble in silver, so that a mixing of these materials with silver is significantly reduced when compared to gold. Since for instance platinum is impermeable to oxygen, while silver has a permeability for oxygen, as described in the publication F. K. Moghadam et al., "Oxygen Diffusion and Solubility Studies in Ag and Pt Using AC Impedance Spectroscopy", J. Electrochem. Soc., pp. 1329 to 1332 (1986), the contact layer 4 can ensure connection, which is stable in the long run, in an oxygen-containing environment.

Due to the described properties of platinum, rhodium and iridium, the contact layer 4 can be kept relatively thin and the use of additional noble metal layers, e.g., of palladium or gold, can be omitted. In particular, the contact layer 4 may have a thickness of equal to or greater than 5 nm and equal to or less than 500 nm, preferably of equal to or greater than 15 nm and equal to or less than 100 nm, and particularly preferably of equal to or greater than 30 nm and equal to or less than 60 nm. For example, the contact layer 4 may have a thickness of 40 nm in the illustrated exemplary embodiment, which achieved very good results in a test.

If the contact layer 4 is to be suitable both for applying a sinter layer and for soldering with customary lead-free soft solders such as SAC (tin-silver-copper), use of, e.g., platinum can avoid problems that might result when using gold contact layers. Thus, the use of a thick gold contact layer in conjunction with SAC may result in the formation of AuSn$_4$ phases, which put the reliability of the solder connection at risk, while a very thin gold contact layer may lead to a higher risk of losing grip in the course of the use of the component.

Figure 2:
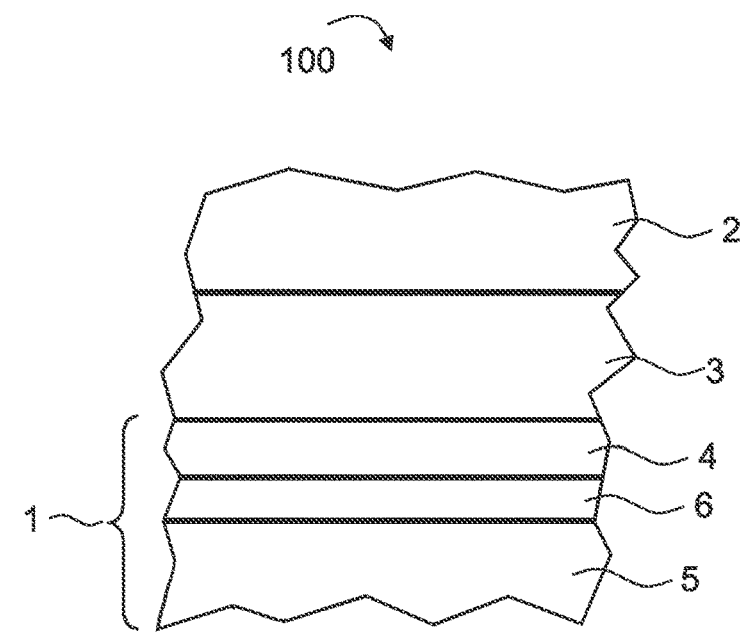

FIG. 2 shows another exemplary embodiment for an electronic device 100, in which the first component 1 on the carrier 5 comprises a layer 6 of an oxidizable material, on which the contact layer 4 is arranged in turn. In particular, the contact layer 4 is applied directly on the layer 6 of the oxidizable material and covers this layer. The contact layer 4 and the layer 6 may be part of a contact arrangement, for example. The oxidizable material of the layer 6 can comprise or be made of titanium, nickel, chromium and/or aluminum. Since the contact layer 4 covers the layer 6, the problems that have been described above in the general part in terms of gold contact layers and silver sinter layers can be avoided.

As an alternative to the exemplary embodiments illustrated in FIGS. 1 and 2, it is also possible that only the second component 2 or both components 1, 2 comprise a contact layer 4 or a contact layer 4 and at least one underlying layer 6 made of an oxidizable material.

Figure 3:
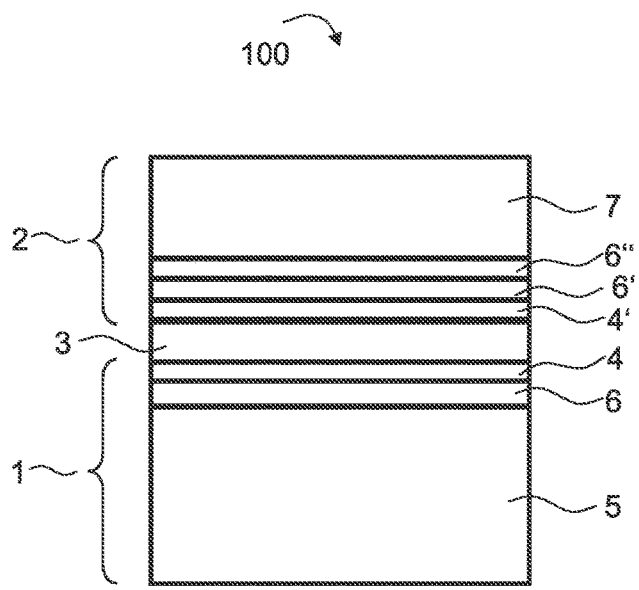
Figure 4:
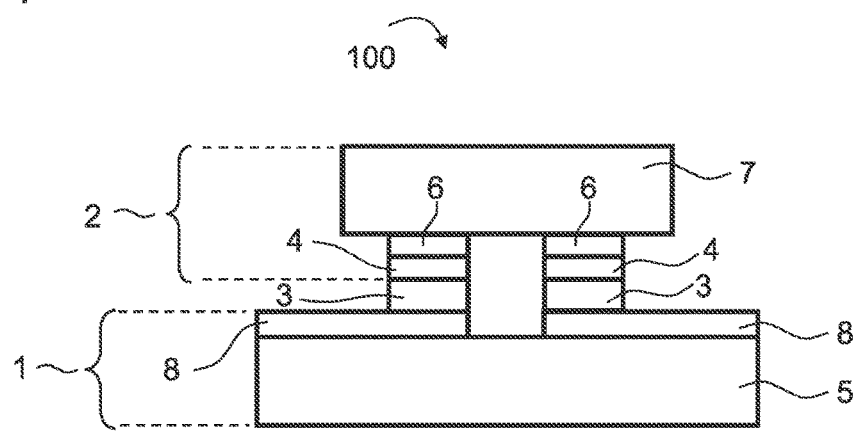

FIGS. 3 and 4 show further exemplary embodiments for electronic devices in a merely exemplary manner. The first and second components 1, 2 specifically described in FIGS. 3 and 4 are merely exemplary and do not limit the present invention.

FIG. 3 shows an exemplary embodiment for an electronic device 100, which comprises an AlN ceramic carrier 5 as a first component 1, which is coated with a layer 6 of titanium having a thickness of 100 nm and a contact layer 4 having a thickness of 20 nm. By means of a sinter layer 3, a second component 2 in the form of a gallium nitride HEMT is mounted in the first component 1, which also comprises a contact layer 4' over layers 6' of nickel and 6" of aluminum. The first and/or the second component 1, 2 may comprise further contact layers, which are not shown for the sake of clarity.

The sinter layer 3 comprises a first metal, while the contact layers 4, 4' each comprise a second metal, which is different from the first metal and which is free of gold. The contact layers 4, 4' are in each case arranged in direct contact to the sinter layer 3 and each comprise or are made of the same material, in particular platinum in the exemplary embodiment shown. Alternatively, the contact layer 4 may comprise a second metal and the contact layer 4' may comprise a third metal, which are different both from another and from the first metal of the sinter layer 3. Both joining partners, i.e., the first component 1 and the second component 2, are connected using a silver sintered paste in the exemplary embodiment shown, wherein optionally a uni-axial pressure, besides a heat treatment during the sintering process, may contribute to the formation of the connection.

FIG. 4 shows another exemplary embodiment for an electronic device 100, in which a second component 2 formed as an optoelectronic semiconductor chip is mounted on a first component 1 formed as a metal core circuit board by means of a silver sinter layer 3. In particular, the semiconductor chip is formed as a light-emitting diode chip in the exemplary embodiment shown.

The first component 1 formed as a metal core circuit board comprises silver-plated electrode layers 8 on a carrier 5, while the semiconductor chip forming the second component 2 comprises electrodes having a nickel layer 6 with a thickness of 200 nm and a contact layer 4 of platinum having a thickness of 15 nm, which is in direct contact to the sinter layer 3.

The semiconductor chip forming the second component 2 may comprise a semiconductor body 7 on the basis of various semiconductor material systems depending on the radiated wavelength. For example, a semiconductor layer sequence on the basis of $In_xGa_yAl_{1-x-y}As$ is suitable for long-waved, infrared to red radiation, a semiconductor layer sequence on the basis of $In_xGa_yAl_{1-x-y}P$ is suitable for red to green radiation and for short-waved visible radiation, i.e., in particular in the range of green to blue light, and/or for UV radiation a semiconductor layer sequence on the basis of $In_xGa_yAl_{1-x-y}N$ is suitable, with $0 \leq x \leq 1$ and $0 \leq y \leq 1$ in each case.

In particular, the semiconductor body 7 of the semiconductor chip may comprise or be made of a semiconductor layer sequence, particularly preferably an epitaxially grown semiconductor layer sequence. To that end, the semiconductor layer sequence can be grown on a growth substrate, e.g., by means of an epitaxy method such as metal organic vapor phase epitaxy (MOVPE) or molecular beam epitaxy (MBE), and be provided with electric contacts. Singulation of the growth substrate having the semiconductor layer sequence grown thereon allows providing a plurality of optoelectronic semiconductor chips.

Furthermore, the semiconductor layer sequence can be transferred to a carrier substrate prior to the singulation and the growth substrate can be thinned or completely removed. Such semiconductor chips, which comprise a carrier substrate in place of the growth substrate, can be referred to as so-called thin film semiconductor chips. The basic principle of a thin film light-emitting diode chip is described, for example, in the publication of I. Schnitzer et al., Appl. Phys. Lett. 63 (16), 18 Oct. 1993, pp. 2174 to 2176.

Like in the exemplary embodiment shown, the electric contacts of the semiconductor chip can be arranged on the same side, or they can be arranged on different sides of the semiconductor layer sequence. In the exemplary embodiment shown, the semiconductor chip comprises the electric contact surfaces on the same side as the sinterable contact layers 4 and is formed as a so-called flip chip with a sapphire substrate, which flip chip is mountable and connectable with the contact layers 4. Alternatively, the semiconductor chip may comprise an electric contact in the form of a sinterable contact layer on a side of a substrate opposite the semiconductor layer sequence, while another contact surface can be formed on a side of the semiconductor layer sequence opposite the substrate, e.g., in the form of a so-called bond pad for contacting by means of a bond wire.

As an alternative to the exemplary embodiment shown, in which the electric connection is established via the sinter layer, it can also be possible to use the sinter layer for a purely thermal connection. To that end, the semiconductor chip can be formed with electric contacts on a side of the semiconductor layer sequence facing away from a substrate, in analogy to the exemplary embodiment of FIG. 4, while a contact layer in the form of a thermal contact layer can be formed on the side of the substrate facing away from the semiconductor layer sequence. The contact layer can be configured as described in conjunction with the preceding exemplary embodiments. The substrate, on which the contact layer is formed, can be electrically insulating. The semiconductor chip can be connected to a heat sink via the thermal contact layer by means of the sinter layer, for example, so that the electric contacts can be used as top side contacts for an electric connection via wire connections. For example, a suitable semiconductor chip may be an AlGaInN-based semiconductor chip with an electrically insulating substrate, e.g., a sapphire substrate. The semiconductor chip can be connected to the thermal contact layer via the sinter layer, for example, with a heat sink that is made of or comprises copper.

Alternatively, or additionally, the exemplary embodiments described in conjunction with the figures may comprise further features described in the general part above. Furthermore, the exemplary embodiments described in conjunction with the figures can be combined with one another according to further exemplary embodiments.

The invention is not limited to the exemplary embodiments through the description by means of these exemplary embodiments. The invention rather includes every new feature as well as every combination of features, which particularly includes any combination of features in the claims, even though this feature or this combination per se is not explicitly indicated in the claims or exemplary embodiments.

The invention claimed is:

1. An electronic device comprising:
a first component and a second component; and
a sinter layer connecting the first component to the second component, the sinter layer comprising a first metal;
wherein each of the first component and the second component comprises at least one contact layer; and
wherein, with respect to each of the first component and the second component:
the at least one contact layer is arranged in direct contact with the sinter layer;
the at least one contact layer comprises a second metal different from the first metal;
the at least one contact layer is free of gold; and
the second metal comprises iridium.

2. The device according to claim 1, wherein the sinter layer is permeable to oxygen.

3. The device according to claim 1, wherein the sinter layer comprises silver.

4. The device according to claim 1, wherein the sinter layer comprises copper.

5. The device according to claim 1, wherein, with respect to each of the first component and the second component, the contact layer comprises a noble metal.

6. The device according to claim 5, wherein, with respect to each of the first component and the second component, the second metal comprises rhodium in combination with the iridium.

7. The device according to claim 5, wherein, with respect to each of the first component and the second component, the second metal comprises platinum in combination with the iridium.

8. The device according to claim 1, wherein, with respect to each of the first component and the second component, the contact layer has a layer thickness of equal to or greater than 5 nm and equal to or less than 500 nm.

9. The device according to claim 1, wherein, with respect to each of the first component and the second component, the contact layer is located on a layer of an oxidizable material.

10. The device according to claim 9, wherein, with respect to each of the first component and the second component, the contact layer is located directly on the layer of the oxidizable material.

11. The device according to claim 9, wherein, with respect to each of the first component and the second component, the oxidizable material comprises titanium, nickel, chromium and/or aluminum.

12. The device according to claim 1, wherein the first component comprises a first carrier element, which is selected from the group consisting of a lead frame, a plastic carrier, a plastic housing, a ceramic carrier, a circuit board, a metal core board and a combination thereof.

13. The device according to claim 1, wherein the second component is an electronic semiconductor chip.

14. A method for producing the electronic device according to claim 1, the method comprising:

placing a sintering material between the first component and the second component; and sintering the sintering material thereby forming the sinter layer between the first and second components.

15. An electronic device comprising:

a first component and a second component; and a sinter layer connecting the first component to the second component, the sinter layer comprising a first metal;

wherein at least one of the first component and the second component comprises at least one contact layer;

wherein the at least one contact layer is arranged in direct contact to the sinter layer;

wherein the at least one contact layer comprises a second metal different from the first metal, and the at least one contact layer is free of gold;

wherein the second metal comprises iridium; and wherein the contact layer is directly located on a layer of an oxidizable material.

16. The device according to claim 15, wherein the second metal further comprises rhodium in combination with the iridium.

* * * * *